US009668339B2

(12) United States Patent
Biskeborn et al.

(10) Patent No.: US 9,668,339 B2
(45) Date of Patent: May 30, 2017

(54) PROTECTION OF DEVICE FROM ELECTROSTATIC DISCHARGE (ESD) DAMAGE

(71) Applicant: International Business Machines Corporation, Armonk, NY (US)

(72) Inventors: Robert G. Biskeborn, Hollister, CA (US); Myron H. Gentrup, San Jose, CA (US); Icko E. T. Iben, Santa Clara, CA (US); Ho-Yiu Lam, Mountain View, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/239,525

(22) Filed: Aug. 17, 2016

(65) Prior Publication Data

US 2016/0360608 A1 Dec. 8, 2016

Related U.S. Application Data

(63) Continuation of application No. 13/902,695, filed on May 24, 2013, now Pat. No. 9,472,949.

(51) Int. Cl.
*H05K 1/02* (2006.01)
*G11B 5/40* (2006.01)
*H01R 43/02* (2006.01)
*H02H 9/04* (2006.01)
*H01R 11/01* (2006.01)

(52) U.S. Cl.
CPC ............ *H05K 1/0259* (2013.01); *G11B 5/40* (2013.01); *H01R 11/01* (2013.01); *H01R 43/0249* (2013.01); *H02H 9/045* (2013.01); *Y10T 29/49169* (2015.01)

(58) Field of Classification Search
None
See application file for complete search history.

(56) References Cited

U.S. PATENT DOCUMENTS

| 7,609,141 | B2 | 10/2009 | Harris |
| 8,199,444 | B2 | 6/2012 | Golcher et al. |
| 8,405,950 | B2 | 3/2013 | Iben et al. |
| 2007/0146941 | A1* | 6/2007 | Harris ............... H01C 7/12 361/18 |
| 2007/0284133 | A1* | 12/2007 | Iben ............... G11B 5/4853 174/102 C |

(Continued)

OTHER PUBLICATIONS

U.S. Restriction Requirement for U.S. Appl. No. 13/902,695 mailed Jun. 6, 2015.

(Continued)

*Primary Examiner* — Courtney Smith
*Assistant Examiner* — Jessey R Ervin
(74) *Attorney, Agent, or Firm* — Sherman IP LLP; Kenneth L. Sherman; Steven Laut

(57) ABSTRACT

A first dissipative adhesive (DA) is connected to at least a portion of leads that are exposed in a first plane of a flexible cable in a coverage area. A second DA is connected over at least a portion of the first DA. A third DA is connected to a ground and over a fourth DA. A servo connection is electrically connected to a grounding tab via the third DA. A common bus bar is connected to the portion of the leads via the second DA.

20 Claims, 10 Drawing Sheets

(56) References Cited

U.S. PATENT DOCUMENTS

| 2009/0288864 A1* | 11/2009 | Iben ................... G11B 5/486 |
| | | 174/259 |
| 2009/0290278 A1* | 11/2009 | Iben ................... H05K 1/0259 |
| | | 361/220 |
| 2012/0033332 A1* | 2/2012 | Bandy, IV .......... G11B 5/00817 |
| | | 360/323 |
| 2013/0057999 A1* | 3/2013 | Boday ................. G11B 5/6094 |
| | | 361/220 |
| 2016/0028228 A1 | 1/2016 | Biskeborn et al. |

OTHER PUBLICATIONS

U.S. Non-Final Office Action for U.S. Appl. No. 13/902,695 mailed Oct. 5, 2015.
U.S. Final Office Action for U.S. Appl. No. 13/902,695 mailed Feb. 16, 2016.
U.S. Advisory Action for U.S. Appl. No. 13/902,695 mailed May 2, 2016.
U.S. Notice of Allowance for U.S. Appl. No. 13/902,695 mailed Jun. 30, 2016.

* cited by examiner

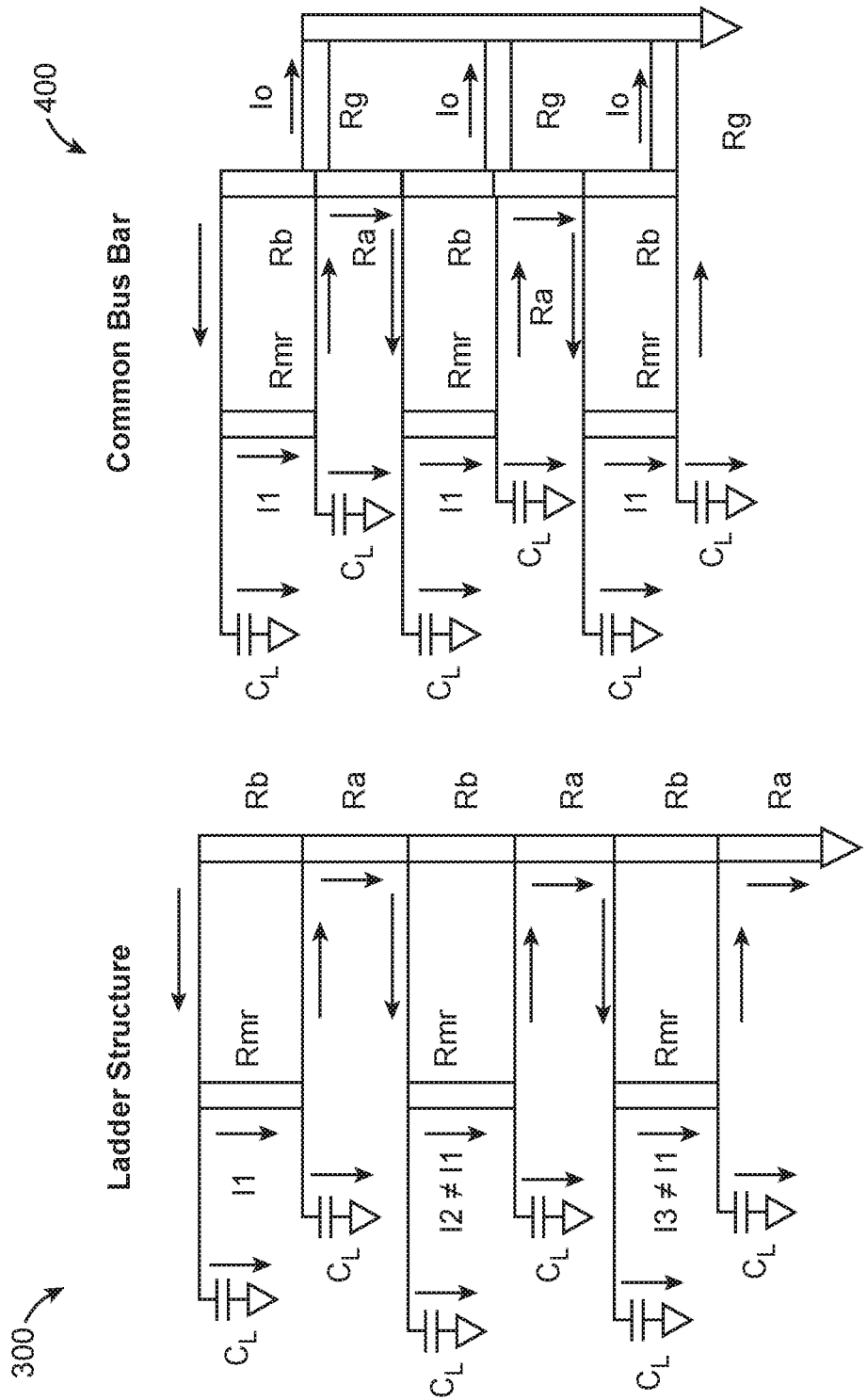

PROTECTION OF DEVICE FROM ELECTROSTATIC DISCHARGE (ESD) DAMAGE

BACKGROUND

Magnetoresistive sensors (MR) and other devices that are sensitive to ESD damage are often connected to a cable in order to electrically connect them to a device (such as a tape or disk drive) for operation. Such devices are extremely sensitive to ESD damage.

SUMMARY

Embodiments relate to ESD protection. One embodiment includes a first dissipative adhesive (DA) is connected to at least a portion of leads that are exposed in a first plane of a flexible cable in a coverage area. A second DA is connected over at least a portion of the first DA. A third DA is connected to a ground and over a fourth DA. A servo connection is electrically connected to a grounding tab via the third DA. A common bus bar is connected to the portion of the leads via the second DA.

Another embodiment comprises an ESD device that includes a first DA coupled to an exposed portion of leads in a first plane of a flexible cable. A second DA is coupled over at least a portion of the first DA. A bus bar is coupled to the exposed portion of the leads via the second DA. A third DA is coupled to a ground, the bus bar, and coupled over a fourth DA. The first DA and the second DA are separated from the third DA and the fourth DA.

These and other features, aspects and advantages of the embodiments will become understood with reference to the following description, appended claims and accompanying figures.

BRIEF DESCRIPTION OF THE DRAWINGS

FIG. 3 illustrates a schematic of a ladder structure for a dissipative adhesive (DA) connection according to one embodiment;

FIG. 4 illustrates a schematic of connecting magnetoresistive sensors (MR) for an electronic device to a common bus bar according to one embodiment;

DETAILED DESCRIPTION

The following description is made for the purpose of illustrating the general principles of the embodiments and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

Embodiments relate to ESD protection. According to an embodiment, a first DA is connected to at least a portion of leads that are exposed in a first plane of a flexible cable in a coverage area. A second DA is connected over at least a portion of the first DA. A third DA is connected to a ground and over a fourth DA. A servo connection is electrically connected to a grounding tab via the third DA. A common bus bar is connected to the portion of the leads via the second DA.

Figure 1:
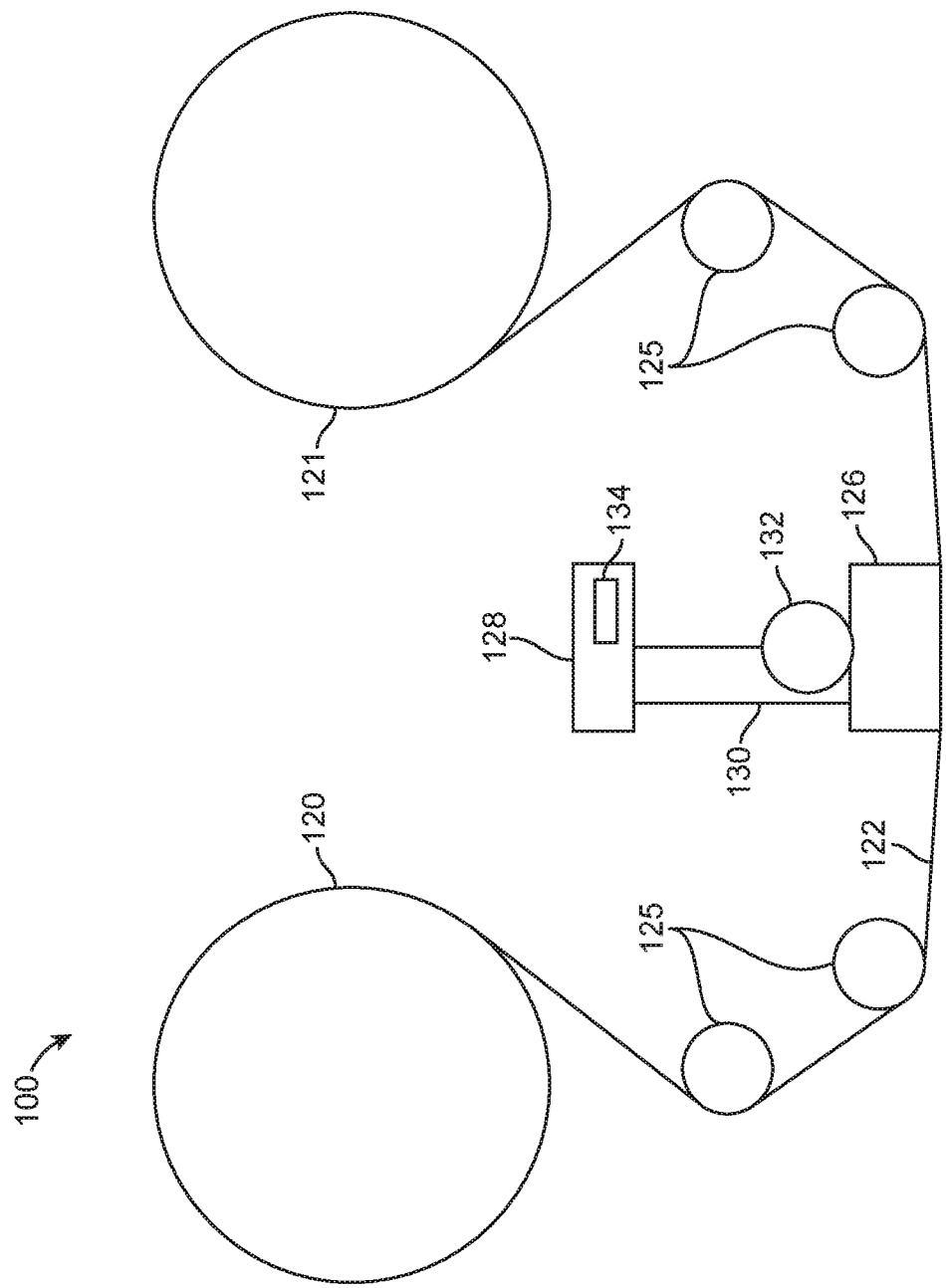
FIG. 1 illustrates a schematic diagram of a simplified tape drive system according to one embodiment.

FIG. 1 illustrates a simplified tape drive 100 of a tape-based data storage system, which may be employed in the context of one or more embodiments. While one specific implementation of a tape drive is shown in FIG. 1, it should be noted that the embodiments described herein may be implemented in the context of any type of tape drive system.

As shown, a tape supply cartridge 120 and a take-up reel 121 are provided to support a tape 122. One or more of the reels may form part of a removable cassette and are not necessarily part of the system 100. The tape drive, such as that illustrated in FIG. 1, may further include drive motor(s) to drive the tape supply cartridge 120 and the take-up reel 121 to move the tape 122 over a tape head 126 of any type.

Guides 125 guide the tape 122 across the tape head 126. Such tape head 126 is in turn coupled to a controller assembly 128 via a cable 130. The controller 128 typically controls head functions such as servo following, writing, reading, etc. The cable 130 may include read/write circuits to transmit data to the head 126 to be recorded on the tape 122 and to receive data read by the head 126 from the tape 122. An actuator 132 controls position of the head 126 relative to the tape 122.

An interface 134 may also be provided for communication between the tape drive and a host (integral or external) to send and receive the data and for controlling the operation of the tape drive and communicating the status of the tape drive to the host, all as will be understood by those of skill in the art.

Figure 2:
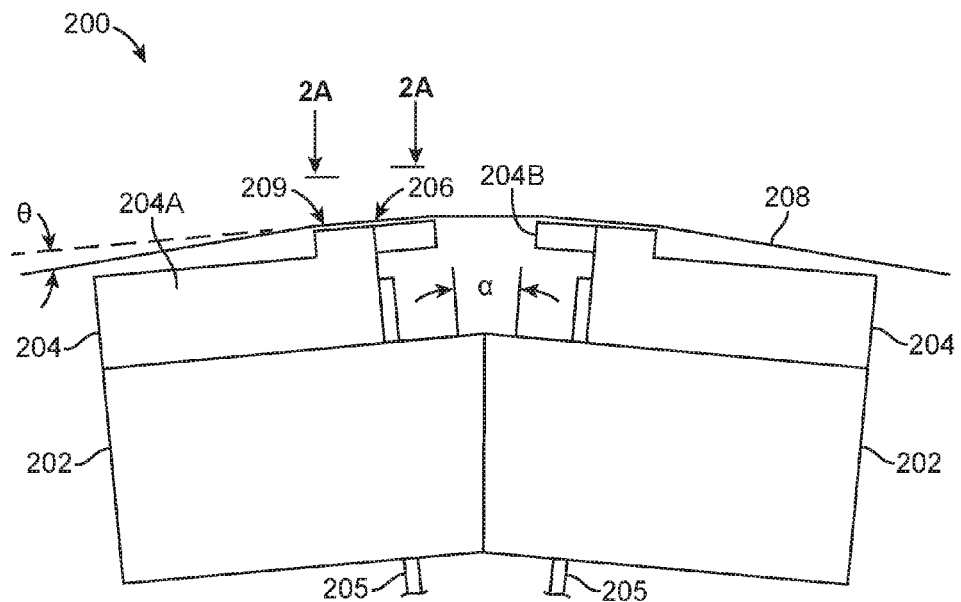
FIG. 2 illustrates a side view of a flat-lapped, bi-directional, two-module magnetic tape head according to one embodiment.

By way of example, FIG. 2 illustrates a side view of a flat-lapped, bi-directional, two-module magnetic tape head 200 which may be implemented in the context of one or more embodiments. As shown, the head includes a pair of bases 202, each equipped with a module 204, and fixed at a small angle α with respect to each other. The bases are typically "U-beams" that may be adhesively coupled together. Each module 204 includes a substrate 204A and a closure 204B with a thin film portion, commonly referred to as a "gap" in which the readers and/or writers 206 are formed. In use, a tape 208 is moved over the modules 204 along a media (tape) bearing surface 209 in the manner shown for reading and writing data on the tape 208 using the readers and writers. The wrap angle θ of the tape 208 at edges going onto and exiting the flat media support surfaces 209 are usually between ¼ degree and 4½ degrees.

The substrates 204A are typically constructed of a wear resistant material, such as a ceramic. The closures 204B made of the same or similar ceramic as the substrates 204A.

The readers and writers may be arranged in a piggyback configuration. The readers and writers may also be arranged in an interleaved configuration. Alternatively, each array of channels may be readers or writers only. Any of these arrays may contain one or more servo readers. Cables 205 couple the readers and/or writers 206 to a controller.

Tape heads with read, write, and servo elements exemplify the concept of an electronic device with multiple elements requiring different diode types. For example, inductive writers do not require diode protection, and attaching diodes across the leads of a writer element will often be deleterious to the writer performance, as the diodes will shunt current away from the writers, decreasing the writer currents for a given applied voltage/current. Often, servo and reader elements operate under different current/voltage (IV) characteristics and thus require different diode designs. Therefore, a single diode chip which is capable of being used with a variety of magnetic head designs and could be wired to the magnetic head in a particular way to avoid negative consequences of attaching diodes across certain elements would be preferable.

Figure 2A:
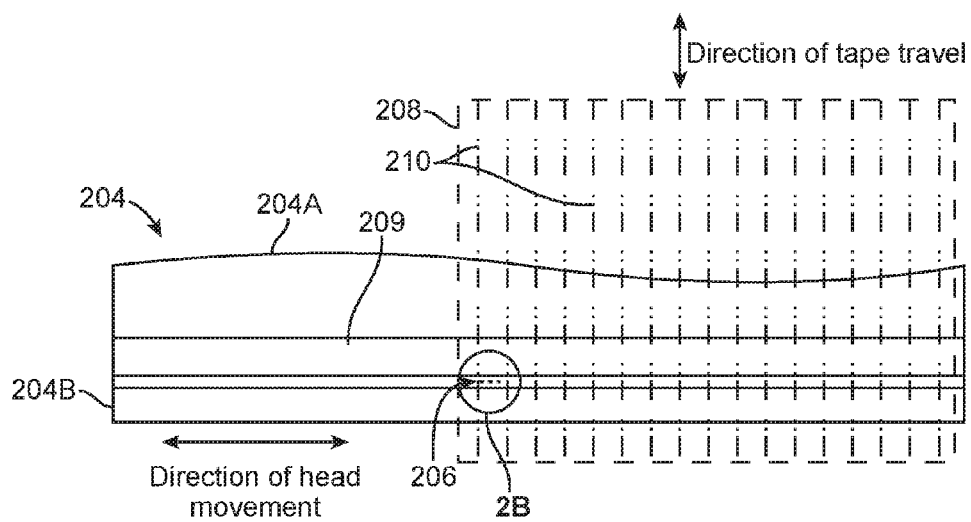
FIG. 2A is a tape bearing surface view taken from Line 2A of FIG. 2.

FIG. 2A illustrates the tape bearing surface 209 of one of the modules 204 taken from Line 2A of FIG. 2. A representative tape 208 is shown in dashed lines. The module 204 is preferably long enough to be able to support the tape as the head steps between data bands.

In this example, the tape 208 includes 4-22 data bands, e.g., with 16 data bands and 17 servo tracks 210, as shown in FIG. 2A on an example, one-half inch wide tape 208. Current linear tape-open (LTO) products include 4 data bands and 5 servo tracks. The data bands are defined between servo tracks 210. Each data band may include a number of data tracks, for example 96 data tracks (not shown). During read/write operations, the readers and/or writers 206 are positioned within one of the data bands. Outer readers, sometimes called servo readers, read the servo tracks 210. The servo signals are in turn used to keep the readers and/or writers 206 aligned with a particular track during the read/write operations.

Figure 2B:
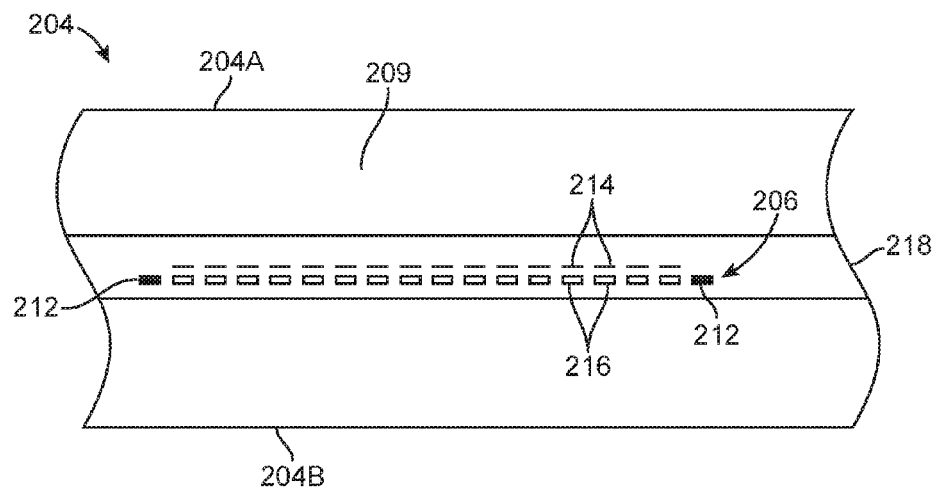
FIG. 2B is a detailed view taken from Circle 2B of FIG. 2A.

FIG. 2B depicts a plurality of readers and/or servos and/or writers 206 formed in a gap 218 on the module 204 in Circle 2B of FIG. 2A. As shown, the array of readers and writers 206 includes, for example, 16 writers 214, 16 readers 216 and two servo readers 212, though the number of elements may vary. Illustrative embodiments include 8, 16, 32, 33, 40, 64, 66, etc. readers and/or writers 206 per array. A preferred embodiment includes 33 readers per array and/or 33 writers per array, 32 of which are used for forward and 32 for reverse tape motion. This allows the tape to travel more slowly, thereby reducing speed-induced tracking and mechanical difficulties. While the readers and writers may be arranged in a piggyback configuration as shown in FIG. 2B, the readers 216 and writers 214 may also be arranged in an interleaved configuration. Alternatively, each array of readers and/or writers 206 may be readers or writers only, and the arrays may contain one or more servo readers 212. In some applications, a module comprises only readers and the writers are disposed on separate modules. For read-while write verification for both forward and reverse tape motion across the read modules when the readers and writers are on different modules, either two reader modules surrounding one write module or two write modules surrounding one read module are built into a head. As noted by considering FIGS. 2 and 2A-B together, each module 204 may include a complementary set of readers and/or writers 206 for such things as bi-directional reading and writing, read-while-write capability, backward compatibility, etc.

Figure 2C:
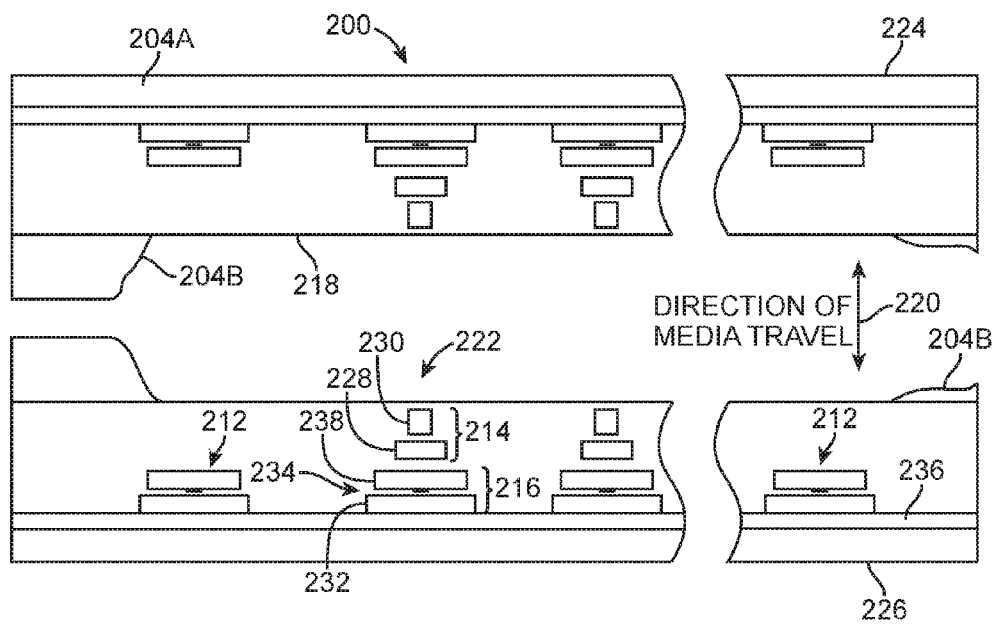
FIG. 2C is a detailed view of a partial tape bearing surface of a pair of modules according to one embodiment.

FIG. 2C shows a partial tape bearing surface view of complimentary modules of a magnetic tape head 200 according to one embodiment. In this embodiment, each module has a plurality of read/write (R/W) pairs in a piggyback configuration formed on a common substrate 204A and an optional electrically insulative layer 236. The writers, exemplified by the write head 214 and the readers, exemplified by the read head 216, are aligned parallel to a direction of travel of a tape medium thereacross to form an R/W pair, exemplified by the R/W pair 222.

Several R/W pairs 222 may be present, such as 8, 16, 32 pairs, etc. The R/W pairs 222 as shown are linearly aligned in a direction generally perpendicular to a direction of tape travel thereacross. However, the pairs may also be aligned diagonally, etc. Servo readers 212 are positioned on the outside of the array of R/W pairs, the function of which is well known.

Generally, the magnetic tape medium moves in either a forward or reverse direction as indicated by arrow 220. The magnetic tape medium and head assembly 200 operate in a transducing relationship in the manner well-known in the art. The piggybacked MR head assembly 200 includes two thin-film modules 224 and 226 of generally identical construction.

Modules 224 and 226 are joined together with a space present between closures 204B thereof (partially shown) to form a single physical unit to provide read-while-write capability by activating the writer of the leading module and reader of the trailing module aligned with the writer of the leading module parallel to the direction of tape travel relative thereto. When a module 224, 226 of a piggyback head 200 is constructed, layers are formed in the gap 218 created above an electrically conductive substrate 204A (partially shown), e.g., of AlTiC, in generally the following order for the R/W pairs 222: an insulating layer 236, a first shield 232 typically of an iron alloy such as NiFe (permalloy), CZT or Al—Fe—Si (Sendust), a sensor 234 for sensing a data track on a magnetic medium, a second shield 238 typically of a nickel-iron alloy (e.g., 80/20 Permalloy), first and second writer pole tips 228, 230, and a coil (not shown).

The first and second writer poles 228, 230 may be fabricated from high magnetic moment materials such as 45/55 NiFe. Note that these materials are provided by way of example only, and other materials may be used. Additional layers such as insulation between the shields and/or pole tips and an insulation layer surrounding the sensor may be present. Illustrative materials for the insulation include alumina and other oxides, insulative polymers, etc.

One method of protecting magnetoresistive sensors (MR) is to connect all the elements to a grounding wire which can then be connected to the ground of the external device (e.g., a tester or a drive) prior to connecting the elements directly to dissipate any voltage differentials between the cabled device (CMOD) and the external electronics. One method to connect the devices together is to apply a DA device across all elements. When the leads are side-by-side, then the resistance to the grounding tab will be lowest for the lead closest to the grounding tab and highest for the lead the furthest away. Thus, the dissipation currents and times will be different for each element. One means of solving the problem is with a common bus bar. In some applications, the geometry of the leads on the cable are such that in order to introduce a common bus bar, the leads would need to pass into another layer in the structure to make the connections. The leads and common bus bar, however, would both need to be exposed to an outer layer of the cable in order to apply the dissipative adhesive. In many cases, there are geometrical or functional restrictions on adding the leads on the available metal layers in the cable structure. For example, many cables have a connector on the outer metal layer, and the connector precludes passing the leads to a common bus bar on the metalized layer used to solder or otherwise connect the leads to the connector. Also, many cables used for high speed electrical signals on the leads have a ground plane on a layer either above or below the leads (e.g., an additional metal layer). In order to add the leads to the layer containing the ground plane would require the ground plane to be disrupted, which can then lead to noise pickup and the degradation of the performance of the device to which the cable leads are attached by decreasing signal-to-noise ratio (SNR) of the device in operation. In other cases, the passing of the leads underneath other wires could also lead to noise pickup, especially with high frequency signals, and again a decrease in the functional SNR.

In one embodiment, due to the geometry dilemma of multiple cable layers, a window is opened on the outer cover layer of the cable, exposing the leads, and a bus bar is attached to the outer surface of the cable near the exposed leads. This embodiment avoids crossing lines in the existing metal layers and enables the application of the DA across the leads. The common bus bar is in a different plane than that of the leads. In one or more embodiments, since the DA is "fluid" when applied, the DA conforms to the different surfaces, electrically joining the leads in one plane with the common bus bar in the second plane.

One or more embodiments apply a bus bar on the surface of a flexible cable. In one embodiment, the bus bar may comprise a metal strip or a dissipative means with a higher conductivity than the dissipative means used to connect the parallel leads attached to the sensitive devices (e.g., an MR). In one or more embodiments, placing the common bus bar strip on the external surface of the flexible cable eliminates the need to pass the leads into a separate layer and pass them underneath other wire traces.

FIG. 3 shows a schematic of a ladder structure 300 for a DA connection, according to one embodiment. In one embodiment, the resistance to ground for a track increases linearly with the distance to ground, and the current through a given sensor (e.g., an MR) during a discharge of connecting the ground tab to an external ground will increase the closer the element is to the grounding tab. In FIG. 3, in one example, Rmr is of the order of 100Ω, Rb is of the order of 7 kΩ, and Ra is of the order of 100 kΩ. In one example, to first order, the sensor N from the grounding tab will have a resistance-to-ground of N*Ra. With the ladder structure 300, the currents passing through and the discharge times of each sensor along the ladder structure will be different.

FIG. 4 shows the schematic 400 of connecting the sensors to a common bus bar. Taking the resistance Rg to be the direct connection from each sensor to the common bus bar, to first order, the current to ground will be Io for all devices. The disadvantages of the ladder structure as compared to the bus bar in schematic 400 may include Adj-Track is an order of magnitude lower than Track-Gnd, wide distribution of track-gnd, discharge currents depend on location in the ladder, and no easy/obvious means of adding a common bus bar internal to the cable. Some of the advantages of the bus bar over the ladder structure 300 may include tighter distribution of the track-gnd, track-gnd is closer to Adj-track, and discharge currents are the same for all tracks.

Figure 5:
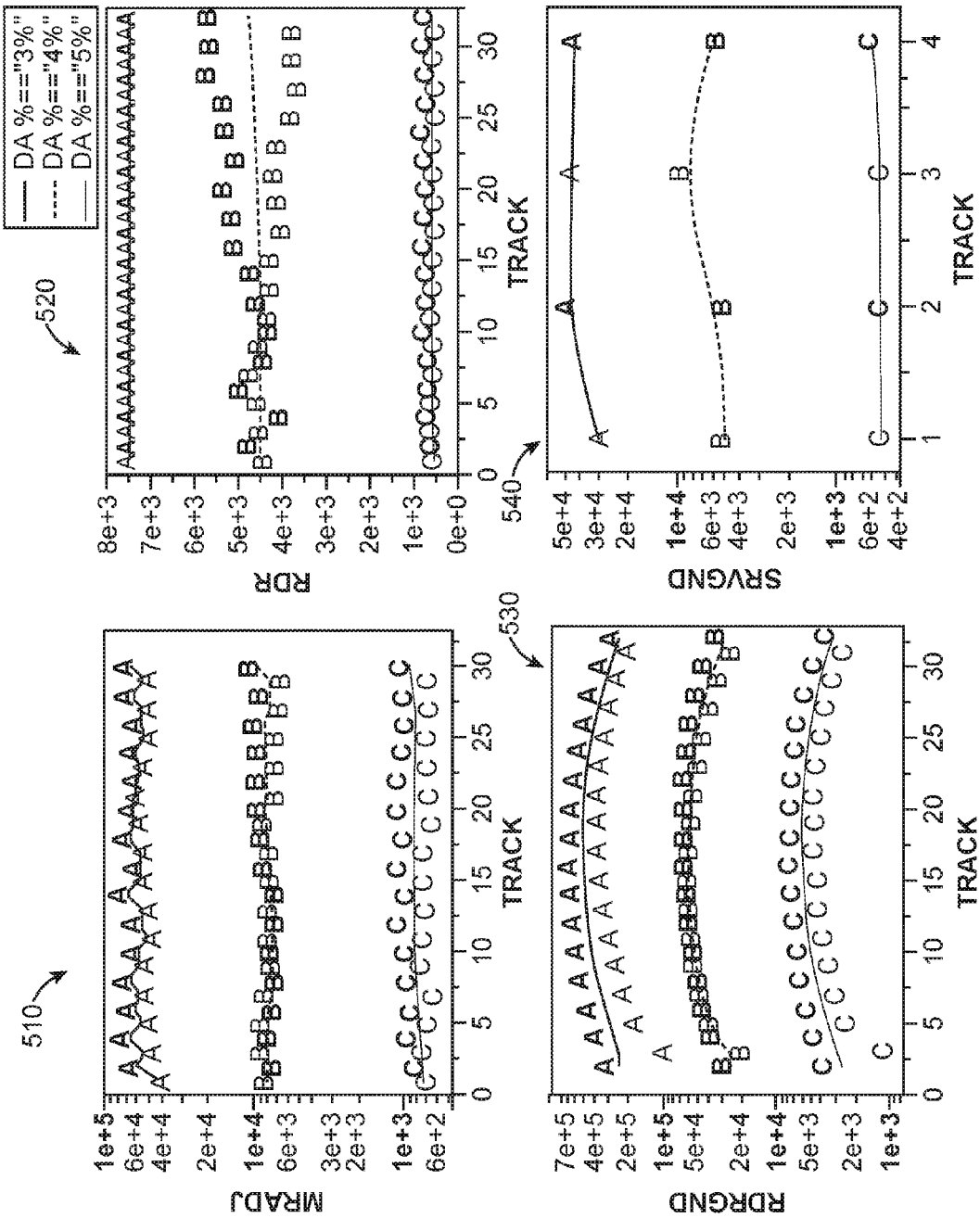
FIG. 5 illustrates resistance data for DA connections without a common bus bar, in accordance with an embodiment.

FIG. 5 illustrates resistance data without a common bus bar for DA concentrations of 3% (A), 4% (B) and 5% (C). Table 1 shows observed resistances for a 3% DA. In one example, the internal resistances are all low at about 7.5 kΩ with a tight distribution. The resistance data shown comprises adjacent track data 510, internal track data 520, track-ground data 530 and servo-ground track data 540. In one example, the adjacent track data 510 is about seven (7) times higher with an average of about 50 kohm(Ω). The track-ground is eight (8) times higher still at about 400 kΩ with a very wide distribution ranging from 100 to 800 kΩ. The servo-Gnd graph 540 shows the servo-Gnd is about 10% of the Trk-Gnd data 530 at about 45 kΩ. The large variation in Trk-Gnd 530, Servo-Gnd 540 and Adjacent-track 510 make the implementation difficult in a manufacturing line where it is best to have these resistances similar.

TABLE 1

Resistances for DA with no common bus bar & 3% DA

|  |  | Internal | Adj-trk | Trk-Gnd | Srv-Gnd |
|---|---|---|---|---|---|
| Average | (kΩ) | 7.5 | 50 | 400 | 45 |
| Max | (kΩ) | 7.5 | 80 | 800 | 50 |
| Min | (kΩ) | 7.5 | 40 | 100 | 30 |

Figure 6:
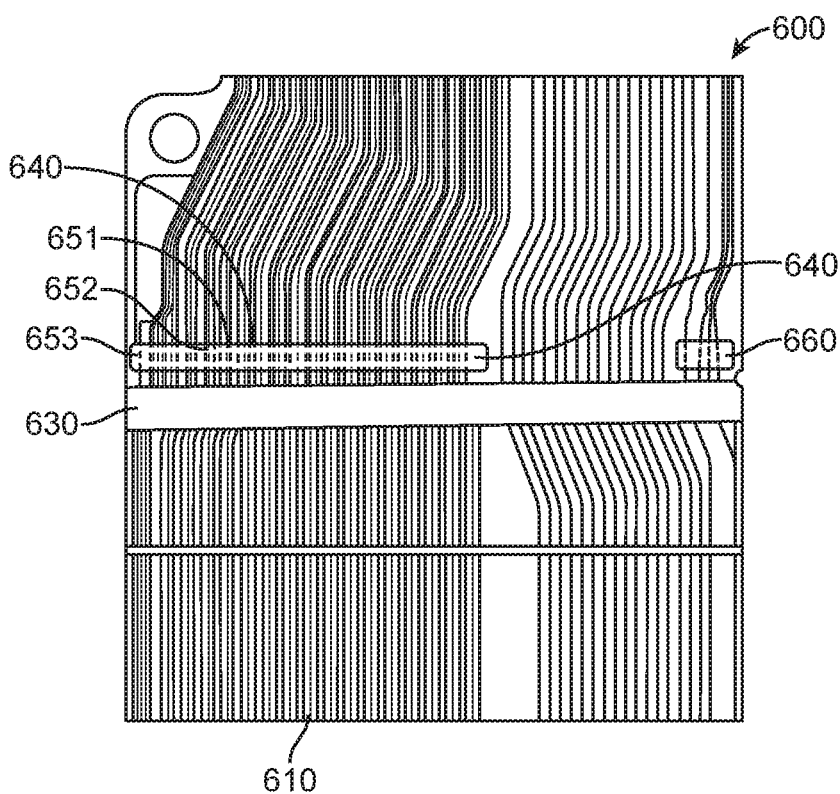
FIG. 6 illustrates a metal bus bar applied to a flexible cable, in accordance with an embodiment.

FIG. 6 illustrates a device 600 including a metal bus bar 630 (e.g., a common bus bar) applied to a cable 610 (e.g., a flexible cable), in accordance with one embodiment. In one example, a metal bus bar 630 comprises a copper (Cu) strip with a pressure sensitive adhesive (PSA) on the back side of the Cu strip. In other embodiments, other metalalized PSAs may be used. In one example, the bus bar 630 is attached to the cable 610 near (e.g., adjacent, next to, etc.) a window 640 exposing the leads (e.g., MR2 leads 651, MR1 leads 652, MR 16 leads 655 (FIG. 7) ground wire 653, AC ground 654 (FIG. 7), AC ground 660, etc.).

Figure 7:
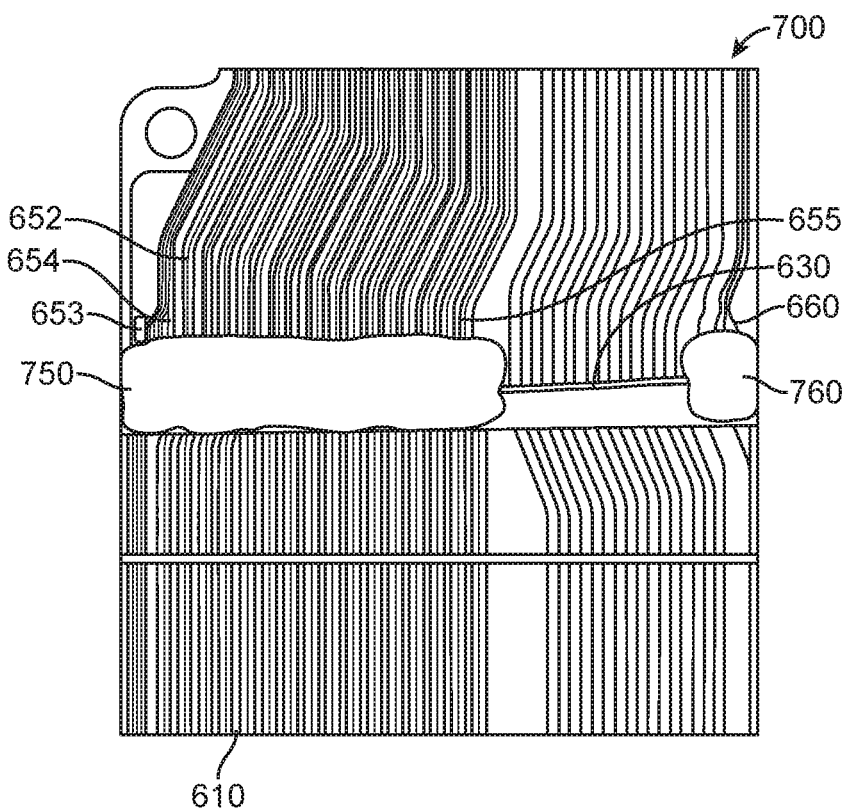
FIG. 7 illustrates a 2.5% DA applied across a window of leads on a flexible cable, in accordance with an embodiment.

FIG. 7 illustrates a device 700 including a 2.5% DA 750 applied across the window 640 of leads on a cable 610, in accordance with one embodiment. In one embodiment, a DA with 2.5% DA 750 comprising carbon content was mixed up and applied across the window 640. In one embodiment, the 2.5% DA 750 connects the leads to one another and to the bus bar 630. In one embodiment, a 2.5% DA 760 is applied across the AC ground 660. In one example, Table 2 shows observed resistances for the device 700. In one example, all resistances are close to one another.

TABLE 2

Resistances for 2.5% DA with External Cu strip bus bar

|  |  | Internal | Adj-trk | Trk-Gnd | Srv-Gnd |
|---|---|---|---|---|---|
| Average | (kΩ) | 7.47 | 174 | 309 | 94 |
| Stdev | (kΩ) | 0.01 | 22 | 76 |  |
| Max | (kΩ) | 7.49 | 202 | 403 |  |
| Min | (kΩ) | 7.45 | 128 | 140 |  |

Figure 8:
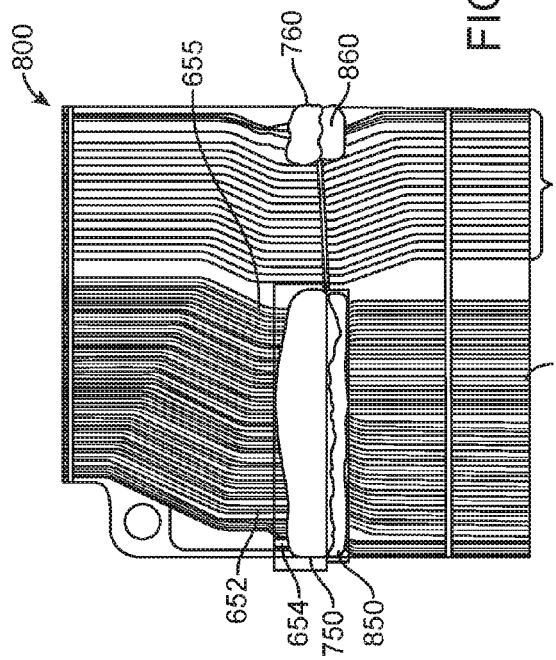
FIG. 8 illustrates a DA bus bar with 5% DA and 2.5% DA connecting leads on a flexible cable, in accordance with an embodiment.

FIG. 8 illustrates a device 800 including a DA bus bar 850 with 5% DA and 2.5% DA 750 connecting leads on a cable 610, in accordance with an embodiment. In one example, device 800 shows an example of a high conductivity DA (5%) Bus bar and DA of 2.5% to connect the leads. In one example, the DA 750 and 850 are not continuous to the 2nd servo section 810. The 2nd servo connection 810 is electrically connected to the grounding tab via a 2.5% DA 760 and ACgnd (660)-5%DA-Gnd 860. Table 3 shows observed resistances for the device 800.

TABLE 3

Resistances for 5% DA with External Bus Bar

|  |  | Internal | Adj-trk | Trk-Gnd | Srv-Gnd |
|---|---|---|---|---|---|
| Average | (kΩ) | 7.38 | 236 | 533 | 186 |
| Stdev | (kΩ) | 0.37 | 43.7 | 156 | 129 |
| Max | (kΩ) | 7.50 | 304 | 751 | 277 |
| Min | (kΩ) | 5.95 | 156 | 179 | 95 |

In one embodiment, the conductivity of the bus bar 630 is greater than conductivity of the DA 750/850. In one embodiment, the bus bar 630 is coupled to an outer surface of the cable 610. In one embodiment, the metal of the PSA tape of the bus bar 630 may comprise copper, aluminum, iron, etc. In one embodiment, the bus bar 630 may be deposited on the surface of the outer layer of the cable 610 via deposition, such as sputtering, chemical vapor deposition, electroplating, etc. In one embodiment, the bus bar 610 may comprise a conductive paint. In one embodiment, the bus bar 610 placement on the outer surface of the cable 610 eliminates passing the leads into a separate layer and passing the leads underneath trace wires. If the concentration of carbon in the common bus bar 630 is too low, then it will be ineffective in distributing the charges along the length of common bus bar 630 and the common bus bar 630 will not function as required. If the concentration of carbon is too high, then the viscosity of the carbon-polymer will be too high to either mix homogeneously or possibly to even mix at all. In one embodiment, the carbon mixture for the DA 750/850 may be in the range of 2.5% to 5%. In other embodiments, the percentage of carbon in the DA mixture may be in other ranges, such as about 2%-6%, 1.7%-5.7%, etc. In one embodiment, a first DA (e.g., DA 750) comprises a compound having carbon in a range of 2.0% to 3%, and a second DA (e.g., DA 850) comprises a compound having carbon in a range of 3.5% to 5%.

Figure 9:
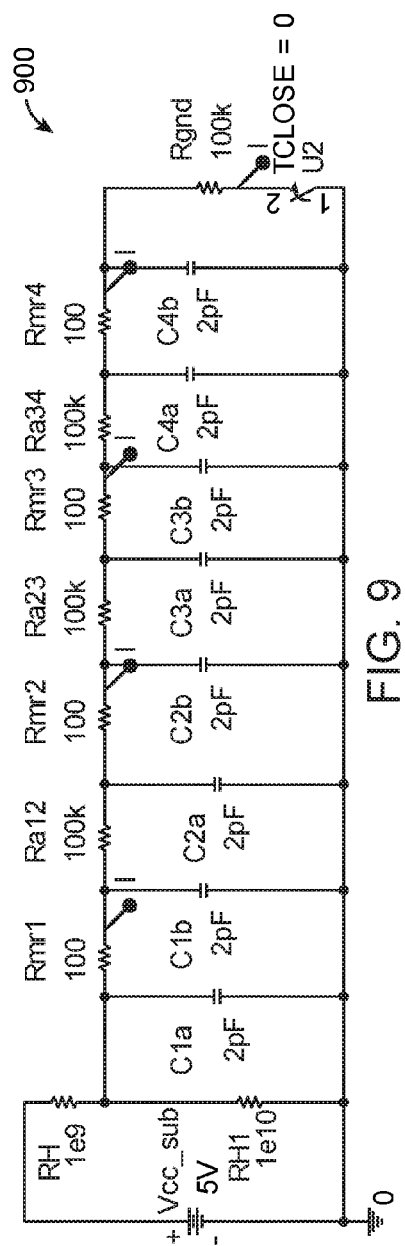
FIG. 9 illustrates a circuit for a ladder structure, in accordance with an embodiment.

FIG. 9 illustrates a circuit 900 for a ladder structure, in accordance with one embodiment. In one embodiment, Rmrj is the MR resistance, for example 100Ω. In one embodiment, Ramn is the DA resistance between MR m to MR n, which is, for example 100 KΩ, where m and n are positive integers. In one embodiment, Rgnd is the resistance from Rmr4 to ground. In one embodiment, Cka and Ckb are the capacitance to ground for the kth MR element, where k is a positive integer.

Figure 10:
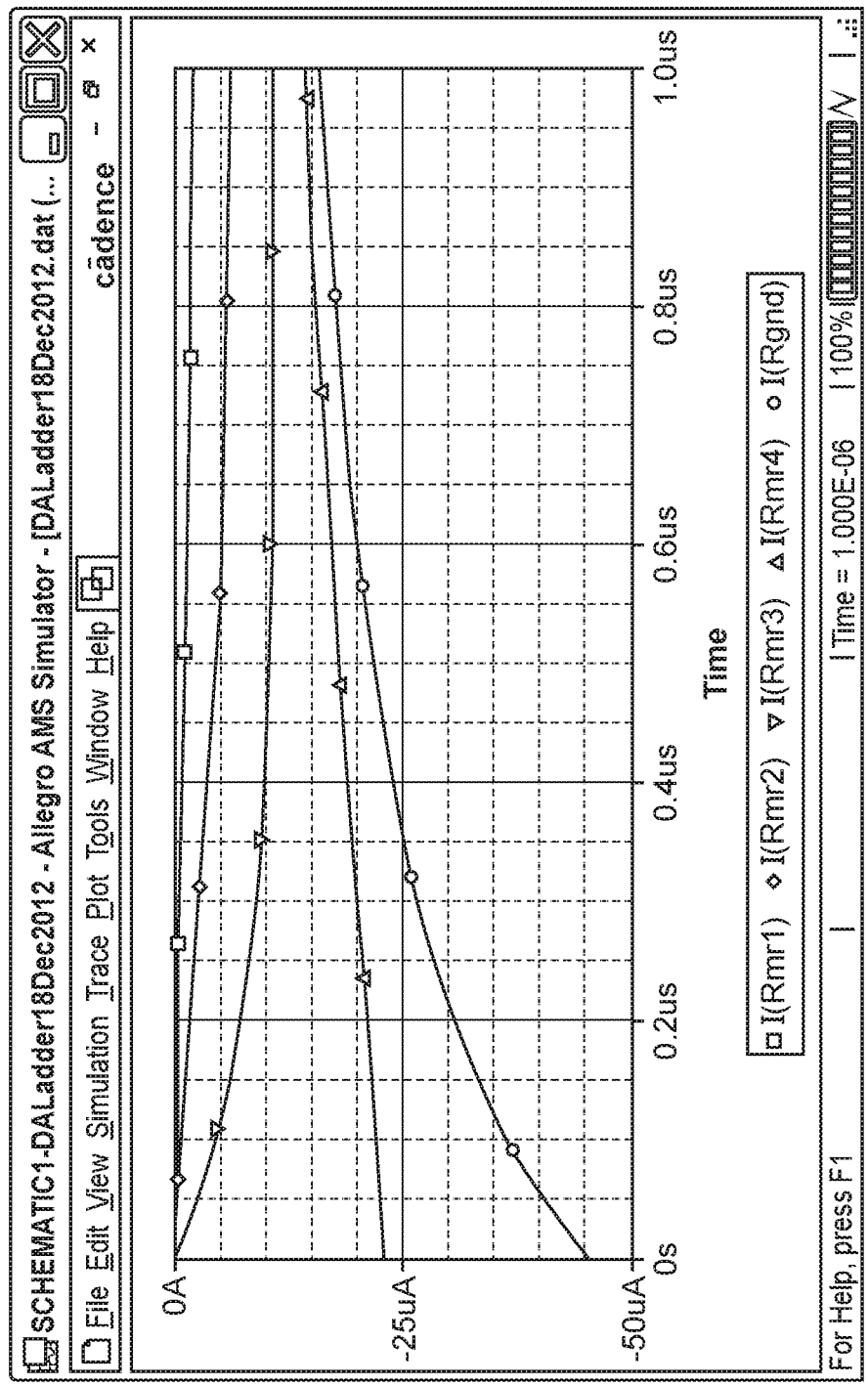
FIG. 10 illustrates discharge current data for the ladder circuit shown in FIG. 9, in accordance with an embodiment.

FIG. 10 illustrates discharge current data 1000 for the ladder circuit shown in FIG. 9, in accordance with one embodiment. The discharge current data 1000 shows that the charges accumulate for the MR elements closer to ground as compared to the elements furthest from ground.

Figure 11:
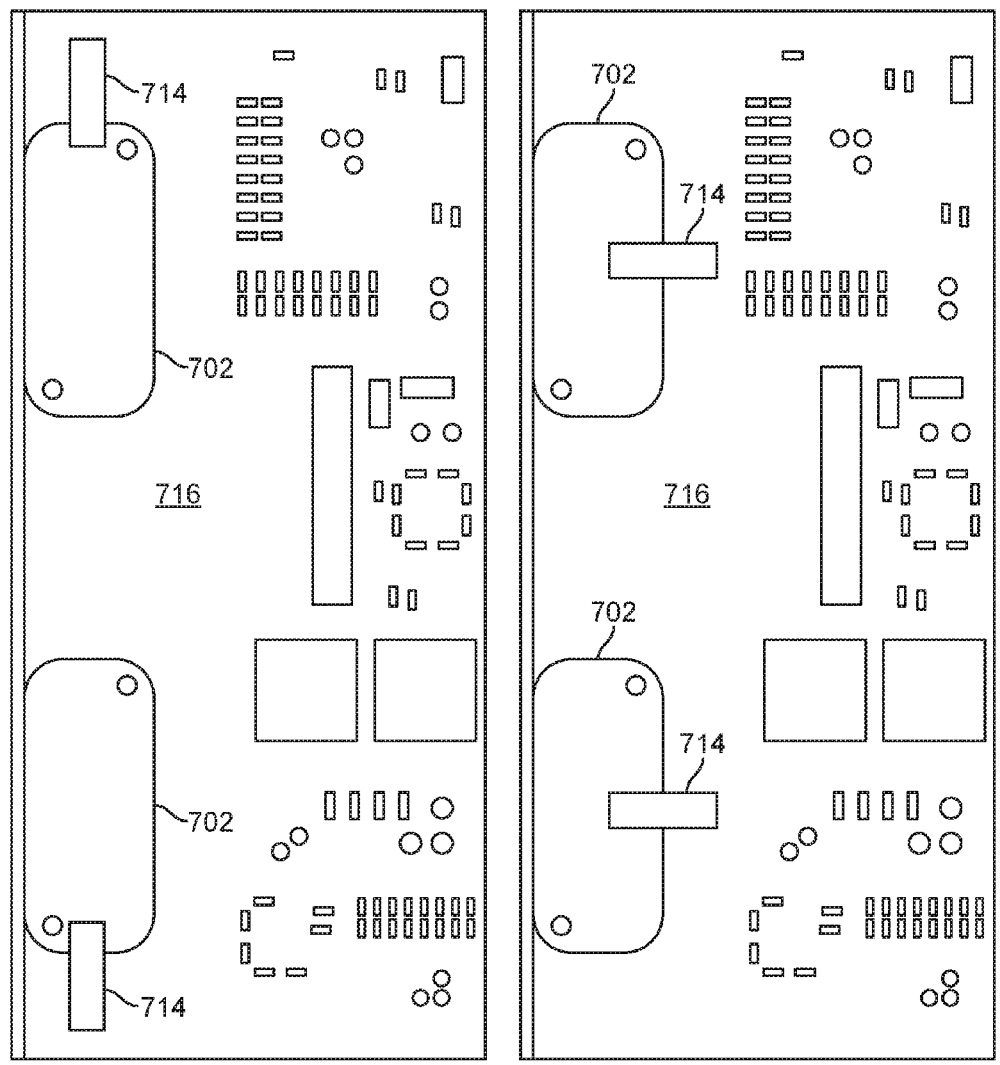
FIG. 11 illustrates a cable interfacing with a circuit board, in accordance with an embodiment.

FIG. 11 illustrates a cable interfacing with a circuit board, in accordance with one embodiment. In one approach, a DA grounding lead 712 is provided with the cable 702, and the lead 712 may also be exposed by a window (e.g., window 640, FIG. 6), and may be coupled to a tab 714 for grounding the DA (e.g., DA 750/850 once it is applied, thereby grounding elements of an electronic device. In one embodiment, this may be accomplished by coupling the tab 714 to a ground on a circuit board 716, as shown in FIG. 11. There are various positions available for placement of the tab 714 as illustrated. Of course, the actual configuration and layout of the cable 702 and the circuit board 716 may dictate which placement is preferred over another, according to some approaches.

In some approaches, the cable 702 may include a grounding lead coupled to a ground of the electronic device for grounding the at least one element of the electronic device through the DA 750/850. In further approaches, the grounding lead may be an integral part of the cable 702 located at least partially beneath a sheath covering the cable 702. In one example, the grounding lead may run beneath a cable sheathing until it reaches an end of the cable 702 at which point it may be exposed, thereby allowing the grounding lead to be grounded.

Figure 12:
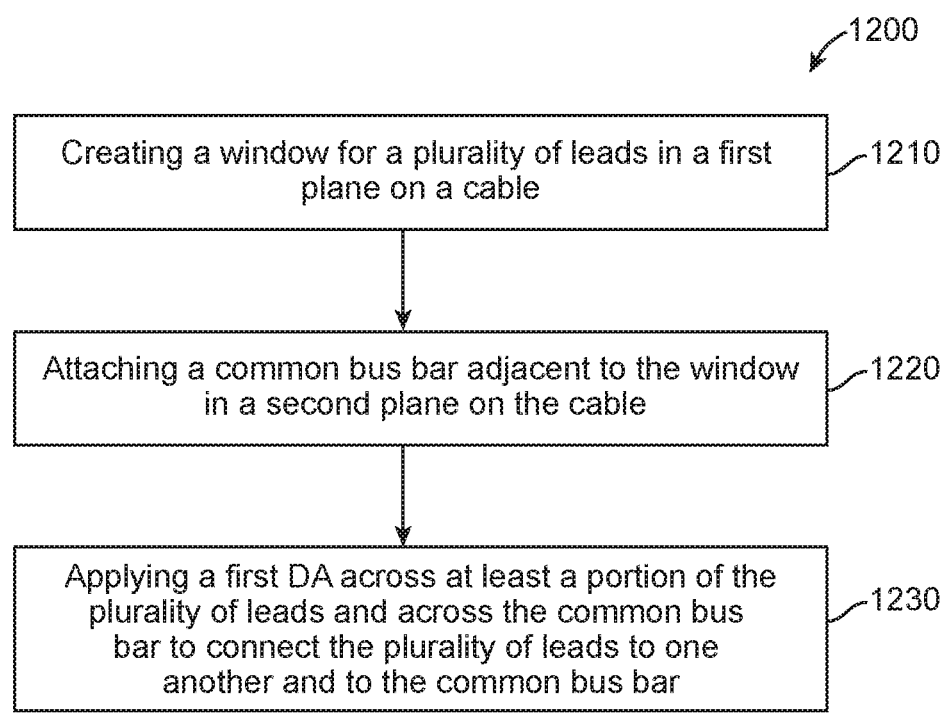
FIG. 12 is a flowchart showing a process for applying a DA and a bus bar on leads on a flexible cable, in accordance with an embodiment.

FIG. 12 is a flowchart showing a process 1200 for applying a DA (e.g., DA 750) and a bus bar (e.g., bus bar 630, DA 850, Etc.) on leads on a flexible cable (e.g., cable 610), in accordance with one embodiment. In one embodiment, in block 1210 ESD protection is provided to an element (e.g., an MR) of an electronic device by opening a window for a plurality of leads in a first plane on a cable (e.g., a flexible cable 610). In one embodiment, in block 1220, a common bus bar is attached adjacent to the window in a second plane on the cable which is different from the plane containing the metal leads. In one embodiment, the plane containing the metal leads and the plane containing the common bus bar is separated by the outer cover layer of the flexible cable. In one embodiment, the thickness of the cover-layer is 10 to 25 microns, so the separation of the layer containing the leads and the layer containing the common bus bar is of the order of 10 to 25 microns. In one embodiment, the separation between the edge of one lead and the next lead is of the order of 50 to 100 microns, so the vertical separation between the metal leads and the layer containing the common bus bar is of the same order of magnitude as the horizontal separation between the leads.

In one embodiment, in block 1230, a first DA (e.g., DA 750) is applied across at least a portion of the plurality of leads and the common bus bar to connect the plurality of leads to one another and to the bus bar. In one embodiment, the designer of the process has the common bus bar aligned in the process of block 1220 an appropriate distance away from the edge of the window on the cover layer to achieve the desired final resistance between the leads and the common bus bar through the first DA depending on the resistivity of the DA and the thickness of the DA, with all the appropriate tolerances taken into consideration. In one embodiment, at least some leads of the plurality of leads are operatively coupled to the element of an electronic device. In one embodiment, the bus bar is coupled to an outer surface of the flexible cable (e.g., a second plane), and conductivity of the bus bar is greater than conductivity of the DA. In one embodiment, the DA connects the plurality of leads to one another in a first plane and connects the leads to the bus bar in a second plane, and the bus bar comprises a metal, a metal PSA tape, a DA, a conductive paint, or other similar materials. In one example the metal or metal tape is deposited on the surface of an outer layer (e.g., a second plane) of the flexible cable via deposition comprising sputtering, chemical vapor deposition, electroplating, etc. In one embodiment, the element of the electronic device comprises a read transducer of a magnetic head.

In one embodiment, the DA is applied across exposed (e.g., via a window) leads on a first plane of a cable. In one embodiment, the DA may include a polymeric thin film, electrically conductive fillers dispersed in the polymeric thin film, and a solvent for controlling a viscosity of the DA. In one embodiment, at least a portion of the solvent is evaporated from the DA. The solvent enables the DA to form around the exposed leads of the cable. In one approach, at least some of the leads may be coupled to an element of an electronic device. After the DA has formed around the leads, the solvent may be evaporated out so that the DA obtains a structure similar to an elastomer, in one approach.

According to one embodiment, the DA may be applied via an application method selected from the group consisting of: syringing, silk screening, painting, and spraying. Of course, any other application method known in the art may be used as well. In one approach, the solvent may be xylene, the polymeric thin film may be a polyurethane, and the electrically conductive fillers may be carbon black. Of course, any other combination of components may be used.

In one approach, the DA may have a viscosity in a range from about 10 CP to about 2000 CP prior to evaporation of the solvent therefrom, and more preferably in a range from about 30 CP to about 250 CP prior to evaporation of the solvent therefrom, enabling the DA to flow around a surface area of the exposed leads of the cable in a coverage area. The coverage area is a portion of the exposed leads where the DA is applied. In one embodiment, the coverage area may be as close to 100% as possible. In other embodiments, and as dictated by the particular application in which the DA is being used, the coverage area may be greater than about 95%, greater than about 90%, greater than about 80%, etc.

In another embodiment, the DA may have a lead-to-lead resistance in a range from about 50 kΩ to about 10 MΩ, about 10 kΩ to about 100 MΩ, or any other range therebetween or as suited to the particular application for which the ESD adhesive is being used.

According to some embodiments, MR sensor protection is immediate once the DA and bus bar are applied, which allows for the DA and bus bar to be applied before the magnetic head is attached to the cable, providing protection through the entire assembly process. In one embodiment, the materials used in the DA and bus bar cause no physical change to the materials used in the cable or the connector assembly. In one embodiment, the low viscosity of the DA allows for increased surface contact with read and/or write transducer leads, thereby providing better protection than more viscous materials; if the viscosity of the ESD adhesive changes, it may be returned to an original viscosity with the addition of a common solvent; the low viscosity of the DA results in desired resistivities not achievable via other materials; the choice of a polymeric material thinned by a solvent results in superior flow properties while also providing a desired resistivity.

It will be clear that the various features of the foregoing methodologies may be combined in any way, creating a plurality of combinations from the descriptions presented above.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It should be emphasized that the above-described embodiments, particularly, any "preferred" embodiments, are merely possible examples of implementations, merely set forth for a clear understanding of the principles of the invention.

Many variations and modifications may be made to the above-described embodiment(s) without departing substantially from the spirit and principles of the invention. All such modifications and variations are intended to be included herein within the scope of this disclosure and the present invention and protected by the following claims.

What is claimed is:

1. An apparatus, comprising:
   a first dissipative adhesive (DA) coupled to at least a portion of leads that are exposed in a first plane of a flexible cable in a coverage area;
   a second DA that is coupled over at least a portion of the first DA; and
   a third DA coupled to a ground and coupled over a fourth DA;
   wherein a servo connection is electrically connected to a grounding tab via the third DA, and a common bus bar is coupled to the portion of the leads via the second DA.

2. The apparatus of claim 1, wherein the common bus bar is disposed in a second plane of the flexible cable.

3. The apparatus of claim 2, wherein the second plane is an outer layer cover of the flexible cable.

4. The apparatus of claim 2, wherein the first DA provides electrostatic discharge (ESD) protection to at least one element of an electronic device, and the first DA electrically joins the portion of the leads in the first plane with the common bus bar in the second plane.

5. The apparatus of claim 3, wherein coupling of the common bus bar to the portion of the leads via the first DA and the second DA avoids crossing lines in existing metal layers of the flexible cable, the first plane comprises an inner layer of the flexible cable exposed via a window opening, and the common bus bar is coupled to the outer layer of the flexible cable.

6. The apparatus of claim 1, wherein conductivity of the common bus bar is greater than conductivity of the first DA and conductivity of the third DA.

7. The apparatus of claim 2, wherein the common bus bar comprises a metal deposited on the flexible cable.

8. The apparatus of claim 2, wherein the common bus bar comprises a conductive paint, and the at least one element of the electronic device is a read transducer of a magnetic head.

9. The apparatus of claim 2, wherein the common bus bar comprises a metalized pressure sensitive adhesive (PSA) tape.

10. The apparatus of claim 1, wherein the common bus bar placement on the outer surface of the flexible cable eliminates passing the leads into a separate layer and passing the leads underneath trace wires.

11. An electrostatic discharge (ESD) device, comprising:
   a first dissipative adhesive (DA) coupled to an exposed portion of leads in a first plane of a flexible cable; and
   a second DA that is coupled over at least a portion of the first DA;
   a bus bar is coupled to the exposed portion of the leads via the second DA; and
   a third DA coupled to a ground, the bus bar, and coupled over a fourth DA,
   wherein the first DA and the second DA are separated from the third DA and the fourth DA.

12. The ESD device of claim 11, wherein the bus bar is disposed in a second plane of the flexible cable and coupled to the exposed portion of the leads via the first DA, and at least a portion of the first DA is coupled over at least a portion of the bus bar.

13. The ESD device of claim 11, wherein the first DA electrically connects the bus bar to the exposed portion of the leads, and the bus bar comprises one of: a second DA, a metal, a conductive paint and a metalized pressure sensitive adhesive (PSA) tape.

14. The ESD device of claim 11, wherein conductivity of the bus bar is greater than conductivity of the first DA and the conductivity of the third DA.

15. The ESD device of claim 12, wherein the second plane is an outer layer cover of the flexible cable and conductivity of the bus bar is greater than conductivity of the first DA.

16. The ESD device of claim 12, wherein a servo connection is electrically connected to a grounding tab via the third DA.

17. The ESD device of claim 12, wherein coupling of the bus bar to the exposed portion of the leads via the first DA and the second DA avoids crossing lines in existing metal layers of the flexible cable.

18. The ESD device of claim 12, wherein the first plane comprises an inner layer of the flexible cable exposed via a window opening, and the bus bar is coupled to the outer layer of the flexible cable.

19. The ESD device of claim 12, wherein the first DA provides ESD protection to at least one element of an electronic device, and the first DA electrically joins the exposed portion of the leads in the first plane with the bus bar in the second plane.

20. The ESD device of claim 19, wherein the at least one element of the electronic device is a read transducer of a magnetic head.

* * * * *